(12) United States Patent
Roy et al.

(10) Patent No.: US 8,547,774 B2
(45) Date of Patent: Oct. 1, 2013

(54) HIERARCHICAL MULTI-BANK MULTI-PORT MEMORY ORGANIZATION

(75) Inventors: Richard S. Roy, Dublin, CA (US); Dipak Kumar Sikdar, Santa Clara, CA (US)

(73) Assignee: MoSys, Inc., Santa Clara, CA (US)

( * ) Notice: Subject to any disclaimer, the term of this patent is extended or adjusted under 35 U.S.C. 154(b) by 393 days.

(21) Appl. No.: 12/697,150

(22) Filed: Jan. 29, 2010

(65) Prior Publication Data

US 2011/0188335 A1 Aug. 4, 2011

(51) Int. Cl.
*G11C 8/00* (2006.01)
*G11C 8/16* (2006.01)

(52) U.S. Cl.
USPC .................. 365/230.03; 365/230.05

(58) Field of Classification Search
None
See application file for complete search history.

(56) References Cited

U.S. PATENT DOCUMENTS

| | | | | | |
|---|---|---|---|---|---|
| 5,359,557 | A | * | 10/1994 | Aipperspach et al. ... | 365/189.02 |
| 5,502,683 | A | * | 3/1996 | Marchioro ............... | 365/230.05 |
| 6,075,745 | A | * | 6/2000 | Gould et al. ............. | 365/230.03 |
| 6,480,947 | B1 | * | 11/2002 | Hasegawa et al. ......... | 711/167 |
| 7,907,468 | B2 | * | 3/2011 | Gajapathy ................ | 365/230.05 |
| 2002/0126562 | A1 | * | 9/2002 | Ngai et al. ............... | 365/230.05 |
| 2003/0135699 | A1 | | 7/2003 | Matsuzaki et al. | |
| 2004/0024952 | A1 | | 2/2004 | Bains et al. | |
| 2005/0135179 | A1 | * | 6/2005 | Eckert et al. ............. | 365/230.05 |
| 2007/0055810 | A1 | * | 3/2007 | Tamura ............... | 711/5 |
| 2007/0073981 | A1 | * | 3/2007 | Im et al. ................. | 711/149 |
| 2007/0201297 | A1 | * | 8/2007 | Kim ..................... | 365/230.05 |
| 2008/0077746 | A1 | * | 3/2008 | Hur ..................... | 711/149 |
| 2008/0225622 | A1 | * | 9/2008 | Hidaka .................. | 365/230.03 |
| 2009/0094412 | A1 | | 4/2009 | Markevitch | |

FOREIGN PATENT DOCUMENTS

WO 97/24725 A1 7/1997

* cited by examiner

*Primary Examiner* — Hoai V Ho
*Assistant Examiner* — James G Norman
(74) *Attorney, Agent, or Firm* — Bever, Hoffman & Harms, LLP

(57) ABSTRACT

A memory system includes multiple (N) memory banks and multiple (M) ports, wherein N is greater than or equal to M. Each of the memory banks is coupled to each of the ports. Access requests are transmitted simultaneously on each of the ports. However, each of the simultaneous access requests specifies a different memory bank. Each memory bank monitors the access requests on the ports, and determines whether any of the access requests specify the memory bank. Upon determining that an access request specifies the memory bank, the memory bank performs an access to an array of single-port memory cells. Simultaneous accesses are performed in multiple memory banks, providing a bandwidth equal to the bandwidth of one memory bank times the number of ports. An additional level of hierarchy may be provided, which allows further multiplication of the number of simultaneously accessed ports, with minimal area overhead.

7 Claims, 4 Drawing Sheets

HIERARCHICAL MULTI-BANK MULTI-PORT MEMORY ORGANIZATION

FIELD OF THE INVENTION

The present invention relates to the addition of multiple ports to a hierarchical multi-bank structure to multiply the available cyclic random bandwidth.

RELATED ART

Prior art has introduced the concept of multiple ports in static random access memory (SRAM) technology to increase the available random bandwidth of a memory system. Multiple ports increase the available transaction generation frequency by the number of ports. However, there is enormous area overhead due to the required use of a multi-port SRAM bit cell.

FIG. 1 is a block diagram of a conventional multi-port SRAM 100, which includes memory cell array 101 and three separate access ports 111-113. Memory cell array 101 is made of a plurality of 3-port SRAM cells. The multi-port nature of the SRAM cells in array 101 allows simultaneous accesses to be performed on each of the three access ports 111-113. For example, a first read access can be performed on access port 111, a second read access can be simultaneously performed on access port 112, and a write access can be simultaneously performed on access port 113. The 3-port SRAM cells of array 101 are much larger than a conventional single port SRAM cell. The large size of the 3-port SRAM cells restricts the usage of multi-port SRAM 100 to small memory instances (typically embedded memory). It would therefore be desirable to have an improved multi-port memory system.

SUMMARY

The present invention introduces a memory system that includes a plurality of memory banks, each having multiple ports. Each of the memory banks includes a corresponding memory array, which is single port in nature. That is, the individual memory arrays are made of single-port memory cells. These single-port memory cells can be, for example, dynamic random access memory (DRAM) cells, embedded DRAM (EDRAM) cells, or flash memory cells.

Simultaneous accesses may be performed on all of the multiple ports at the top (chip) level. However, none of these simultaneous accesses may address the same individual memory bank. Each of the individual memory banks may be accessed from any one of the multiple ports. However, each of the individual memory banks is only accessed from (at most) one of the multiple ports during any given access cycle. In one embodiment, a multiplexer structure within each memory bank couples the corresponding memory array to each of the multiple ports.

In one embodiment, the multi-bank multi-port memory system can be expanded to include an additional level of hierarchy (i.e., partitions), which allows further multiplication of the number of simultaneously accessed ports, with minimal area overhead. All ports at the partition level may be simultaneously accessed. In this embodiment, the number of concurrent accesses per cycle equals the number of partitions times the number of ports. For example, in a memory system having three ports and four partitions, the cyclic random bandwidth is multiplied by 12, while the area overhead is increased by less than five percent, compared to a single port memory structure.

The present invention will be more fully understood in view of the following description and drawings.

DETAILED DESCRIPTION

Figure 1:
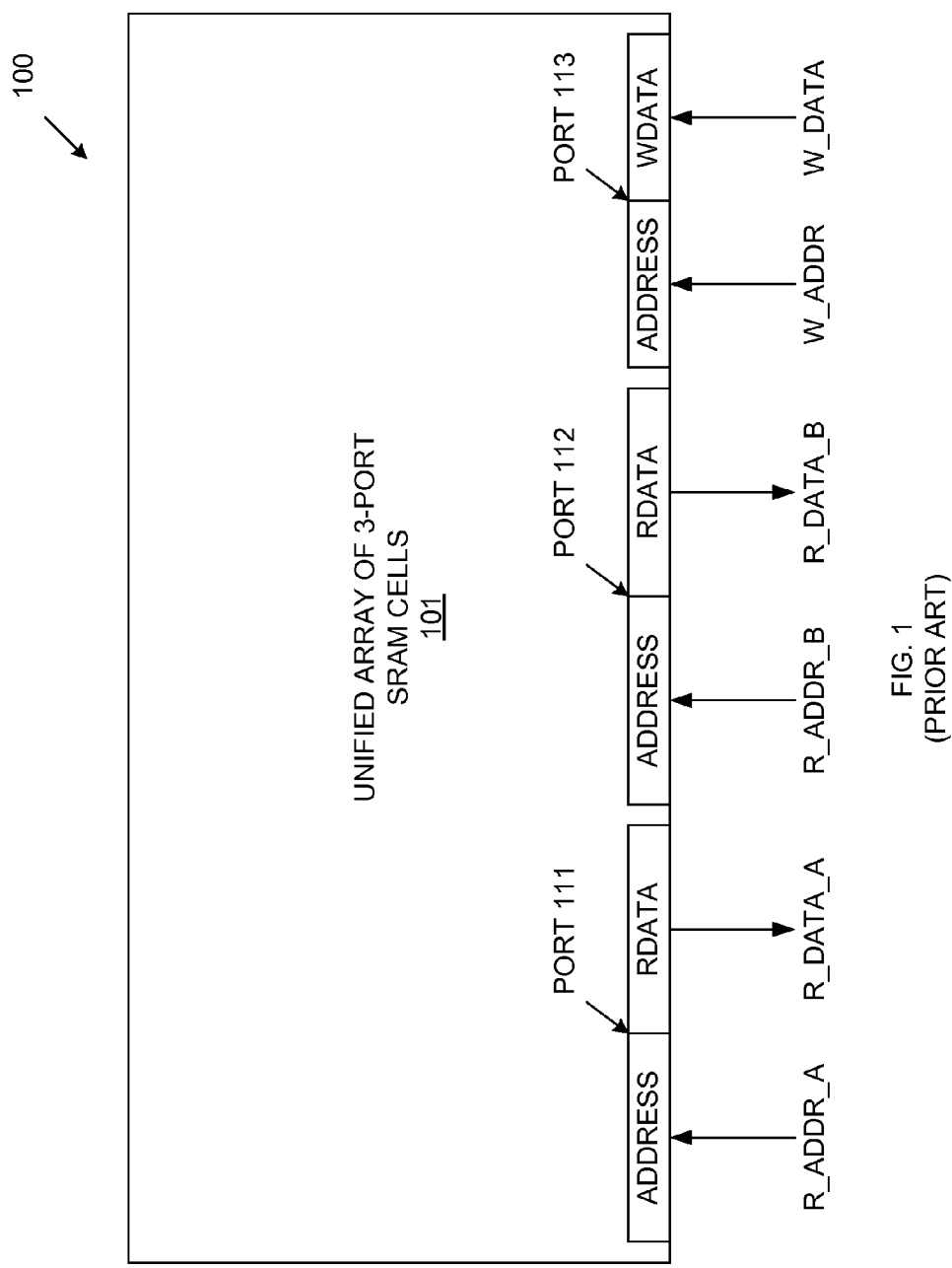
FIG. 1 is a block diagram of a conventional three-port memory system, which includes an array of three-port memory cells.
Figure 2:
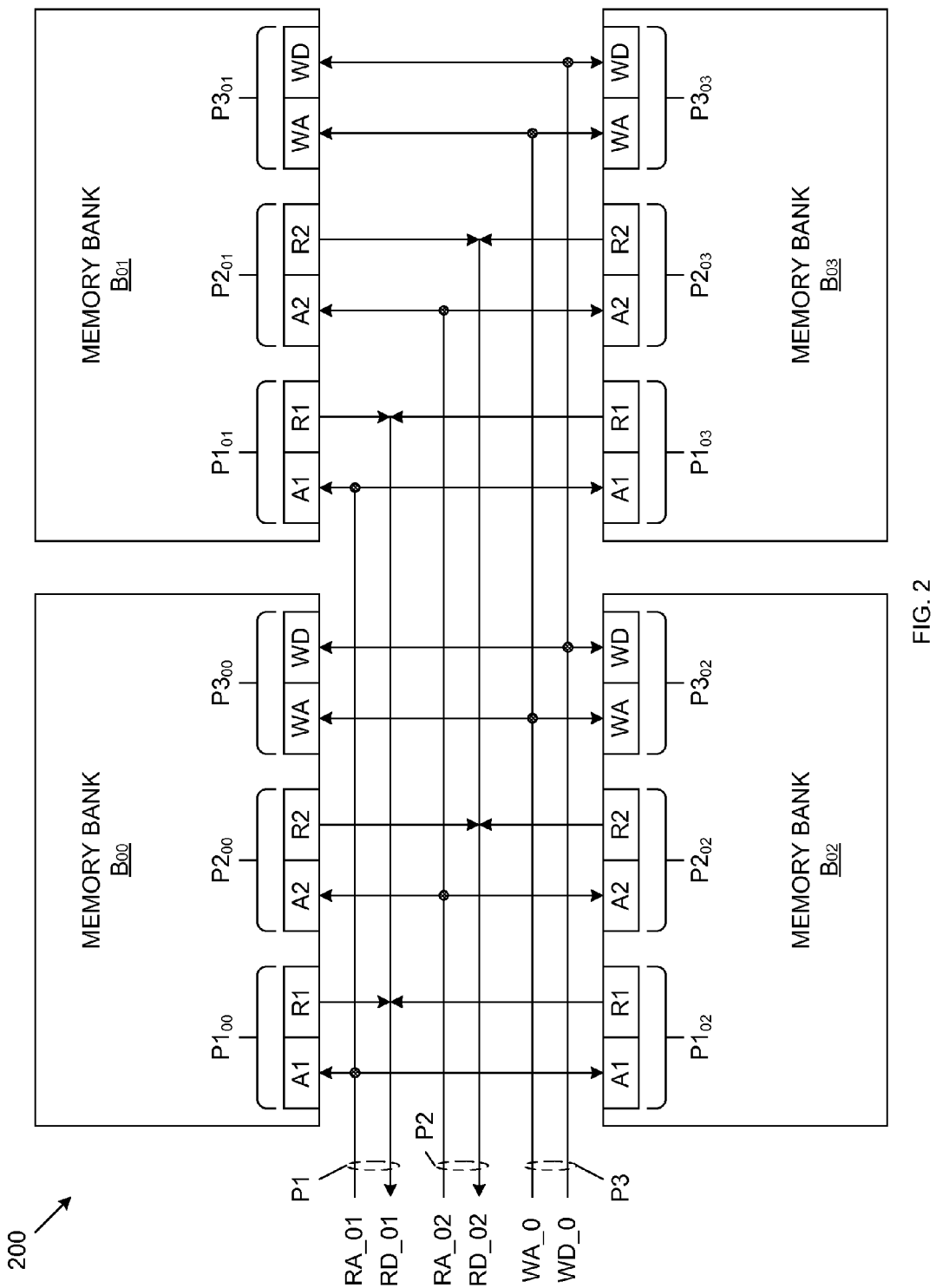
FIG. 2 is a block diagram of a multi-port multi-bank memory system in accordance with one embodiment of the present invention.

FIG. 2 is a block diagram of a multi-port multi-bank memory system 200 in accordance with one embodiment of the present invention. Memory system 200 includes four memory banks $B_{00}$-$B_{03}$ and three access ports P1-P3. Although memory system 200 includes four memory banks and three access ports, it is understood that memory system 200 can include other numbers of memory banks and other numbers of ports, as long as the number of memory banks is greater than or equal to the number of ports.

In the embodiment illustrated by FIG. 2, ports P1 and P2 are read ports, and port P3 is a write port. The first read port P1 includes a first read address bus RA_01 and a first read data bus RD_01. The second read port P2 includes a second read address bus RA_02 and a second read data bus RD_02. The write port P3 includes a write address bus WA_0 and a write data bus WD_0.

Each of the memory banks $B_{00}$-$B_{03}$ is coupled to each of the three ports P1-P3. More specifically, each memory bank $B_{XX}$ includes a first read port $P1_{XX}$ (which is coupled to port P1), a second read port $P2_{XX}$ (which is coupled to port P2) and a write port $P3_{XX}$ (which is coupled to port P3), wherein XX=00, 01, 02 and 03.

The first read address bus RA_01 provides read addresses to the first read ports $P1_{00}$, $P1_{01}$, $P1_{02}$ and $P1_{03}$, through bus connections labeled A1. The first read data bus RD_01 receives read data values from the first read ports $P1_{00}$, $P1_{01}$, $P1_{02}$ and $P1_{03}$, through bus connections labeled R1.

The second read address bus RA_02 provides read addresses to the second read ports $P2_{00}$, $P2_{01}$, $P2_{02}$ and $P2_{03}$, through bus connections labeled A2. The second read data bus RD_01 receives read data values from the second read ports $P2_{00}$, $P2_{01}$, $P2_{02}$ and $P2_{03}$, through bus connections labeled R2.

The write address bus WA_0 provides write addresses to the write ports $P3_{00}$, $P3_{01}$, $P3_{02}$ and $P3_{03}$, through bus connections labeled WA. The write data bus WD_0 provides write data values to write ports $P3_{00}$, $P3_{01}$, $P3_{02}$ and $P3_{03}$, through bus connections labeled WD.

An external device (or devices) may initiate accesses to memory system 200 in the following manner. Accesses may be simultaneously initiated on ports P1, P2 and/or P3, as long as none of these simultaneous accesses specify the same memory bank. For example, a read access on port P1 may access memory bank $B_{00}$ at the same time that a read access on port P2 accesses memory bank $B_{02}$, and a write access on port P3 accesses memory bank $B_{03}$. Because each of the memory banks $B_{00}$-$B_{03}$ is accessed by, at most, one of the ports P1-P3 at any given time, the memory banks $B_{00}$-$B_{03}$ can be implemented using single-port memory cells. The internal structure of memory banks $B_{00}$-$B_{03}$ is described in more detail below.

Figure 3:
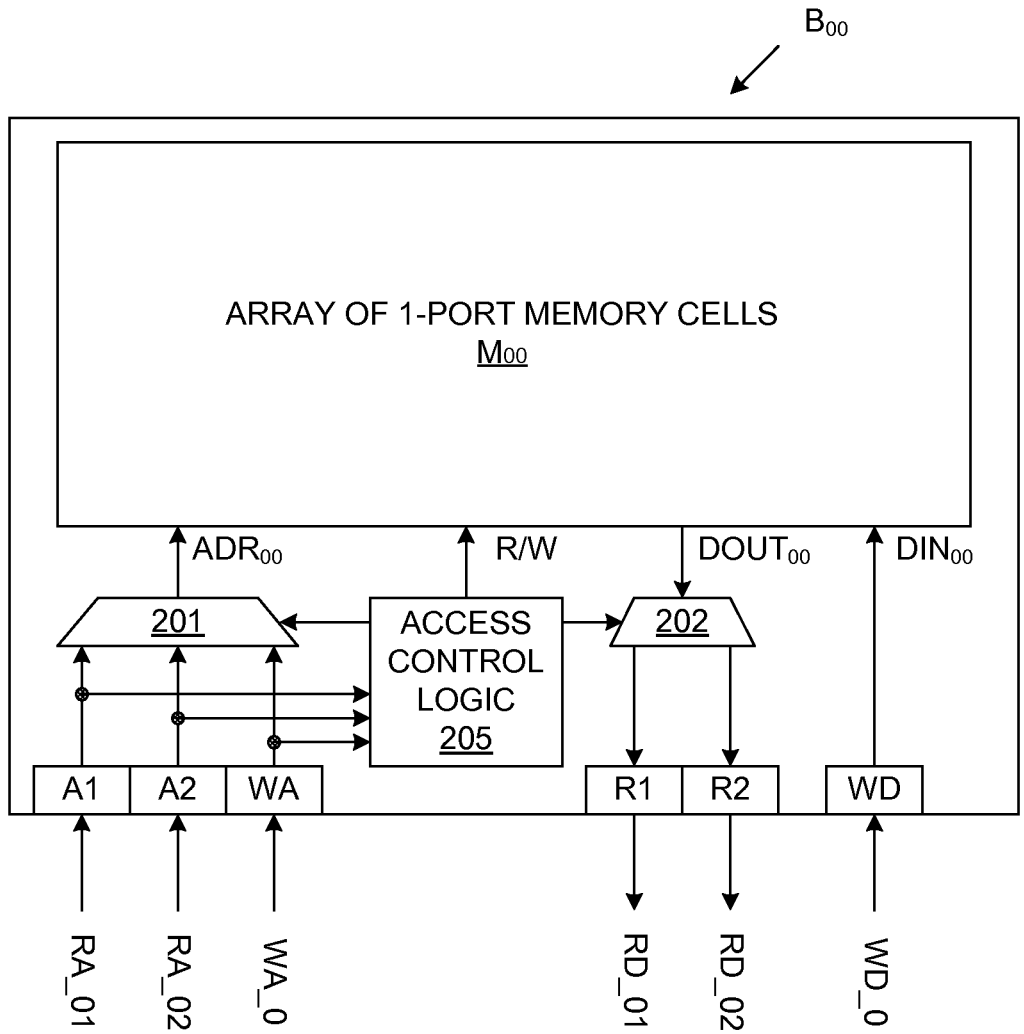
FIG. 3 is a block diagram illustrating a memory bank of the multi-port multi-bank memory system of FIG. 2, in accordance with one embodiment of the present invention.

FIG. 3 is a block diagram illustrating memory bank $B_{00}$ in more detail, in accordance with one embodiment of the present invention. Memory banks $B_{01}$, $B_{02}$ and $B_{03}$ are identical to memory bank $B_{00}$ in the described embodiments. Memory bank $B_{00}$ includes multiplexer 201, de-multiplexer 202, access control logic 205, and memory array $M_{00}$. Memory array $M_{00}$ includes an array of single-port memory cells. These single-port memory cells can be, for example, dynamic random access memory (DRAM) cells, static random access memory (SRAM) cells, embedded DRAM (EDRAM) cells, or flash memory cells. Multiplexer 201 and access control logic 205 are coupled to receive the read address on the first read address bus RA_01 (via bus connections A1), the read address on the second read address bus RA_02 (via bus connections A2), and the write address on the write address bus WA_0 (via bus connections WA). Each of these received addresses includes a bank address (which specifies one of the memory banks $B_{00}$-$B_{03}$) and a local address (which specifies a row/column location within the memory array of the memory bank). Access control logic 205 determines whether one of the received read addresses or the received write address includes a bank address that specifies the memory bank $B_{00}$. In one embodiment, memory bank $B_{00}$ is assigned a unique address, and access control logic 205 compares the bank addresses received on buses RA_01, RA_02 and WA_0 with this unique address to determine whether memory bank $B_{00}$ is specified for an access. During any given access cycle, only one (or none) of the buses RA_01, RA_02 and WA_0 will carry a bank address that specifies memory bank $B_{00}$.

If access control logic 205 determines that one of the buses RA_01, RA_02 and WA_0 carries a bank address that specifies memory bank $B_{00}$, then access control logic 205 will cause multiplexer 201 to route the associated local (row/column) address to memory array $M_{00}$, as the array address signal $ADR_{00}$. For example, if access control logic 205 detects that the bank address on read address bus RA_01 specifies memory bank $B_{00}$, then access control logic 205 will cause multiplexer 201 to route the local (row/column) address from read address bus RA_01 to single-port memory array $M_{00}$.

Access control logic 205 also generates a read/write access control signal (R/W) in response to the received addresses. If access control logic 205 determines that a matching bank address is received on one of the read address buses RA_01 or RA_02, then access control logic 205 generates a R/W access control signal that specifies a read operation. If access control logic 205 determines that a matching bank address was received on the write address bus WA_0, then access control logic 205 generates a R/W access control signal that specifies a write operation. If access control logic 205 determines that no matching bank address was received on address buses RA_01, RA_02 or WA_0, then access control logic 205 generates a R/W access control signal that specifies an idle cycle (no operation).

If the R/W control signal indicates that a matching bank address was received on one of the read address buses RA_01 or RA_02, then memory array $M_{00}$ performs a read operation to the address location specified by the array address $ADR_{00}$. The resulting read data value $DOUT_{00}$ is provided from memory array $M_{00}$ to de-multiplexer 202. Access control logic 205 causes de-multiplexer 202 to route the read data value $DOUT_{00}$ to the read data bus associated with the read access. For example, if the matching bank address was received on the first read address bus RA_01 (i.e., port P1), then de-multiplexer 202 routes the read data value $DOUT_{00}$ to the first read data bus RD_01 (i.e., port P1). Conversely, if the matching bank address was received on the second read address bus RA_02 (i.e., port P2), then de-multiplexer 202 routes the read data value $DOUT_{00}$ to the second read data bus RD_02 (i.e., port P2).

If the R/W control signal indicates that a matching bank address was received on the write address bus WA_0, then memory array $M_{00}$ performs a write operation, whereby the write data value on write data bus WD_0 (i.e., $DIN_{00}$) is written to the address location specified by the array address $ADR_{00}$.

Assuming that each of the memory banks $B_{00}$-$B_{03}$ operates at a frequency F, then memory system 200 may operate at a maximum frequency of 3×F. That is, two read operations may be simultaneously performed at frequency F on ports P1 and P2, while one write operation is simultaneously performed at frequency F on port P3.

Figure 4:
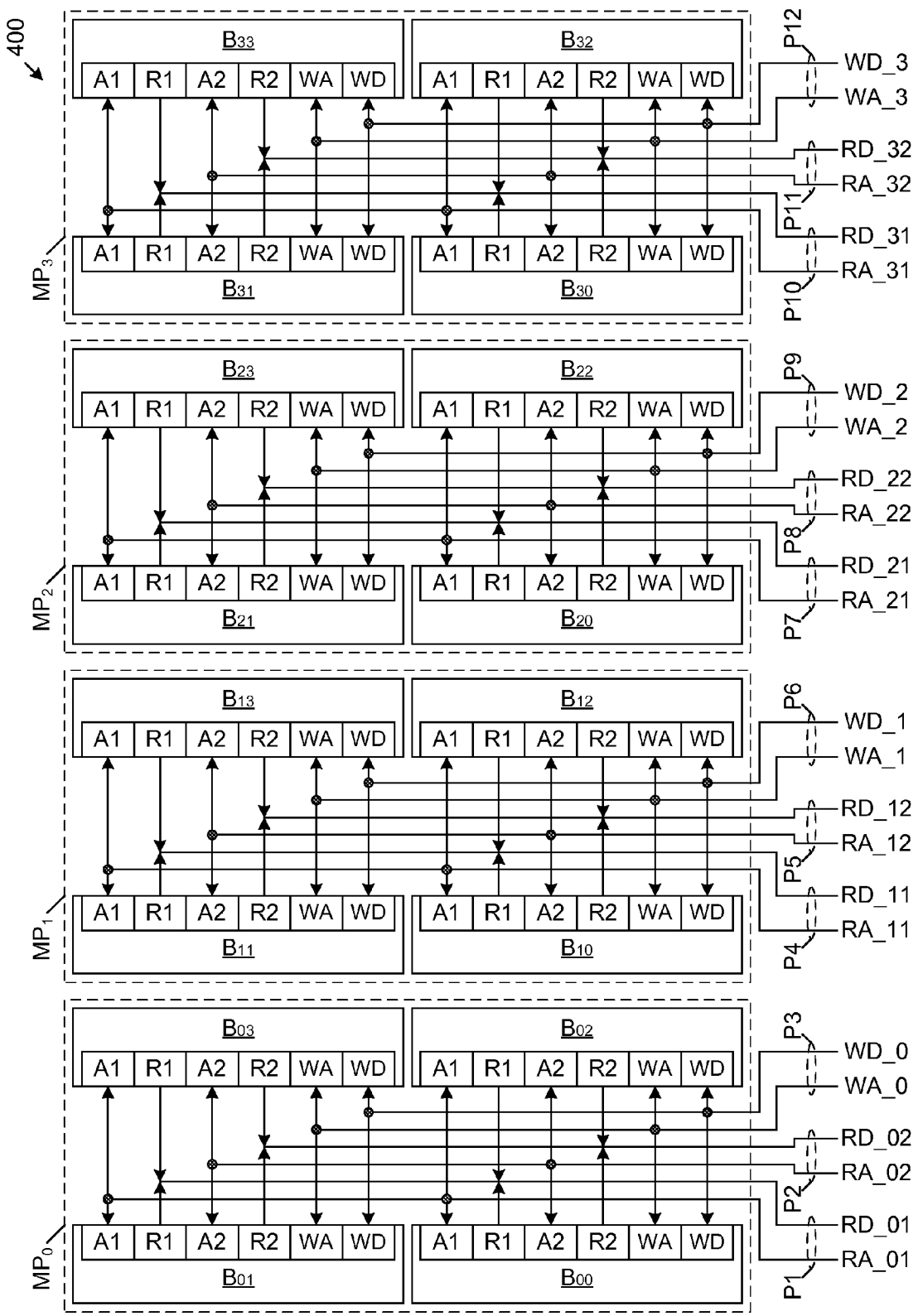
FIG. 4 is a block diagram of a memory system that includes four memory partitions, in accordance with another embodiment of the present invention.

FIG. 4 is a block diagram of a memory system 400 that includes four memory partitions $MP_0$-$MP_3$, in accordance with another embodiment of the present invention. In the described embodiment, memory partition $MP_0$ is identical to memory system 200 (FIGS. 2-3). Thus, memory partition $MP_0$ includes memory banks $B_{00}$-$B_{03}$ and ports P1-P3, as described above. Memory partitions $MP_1$-$MP_3$ are identical to memory partition $MP_0$. Memory partitions $MP_1$, $MP_2$ and $MP_3$ include memory banks $B_{10}$-$B_{13}$, $B_{20}$-$B_{23}$ and $B_{30}$-$B_{33}$, respectively, and ports P4-P6, P7-P9 and P10-P12, respectively. Memory banks $B_{10}$-$B_{13}$, $B_{20}$-$B_{23}$ and $B_{30}$-$B_{33}$ are identical to memory banks $B_{00}$-$B_{03}$. Ports P4-P5, P7-P8 and P10-P11 are read ports, similar to read ports P1-P2. Ports P6, P9 and P12 are write ports, similar to write port P3.

Up to eight read operations and four write operations may be performed simultaneously within memory system 400. More specifically, eight read operations may be initiated by providing read addresses on the read address buses RA_01, RA_02, RA_11, RA_12, RA_21, RA_22, RA_31 and RA_32 of ports P1, P2, P4, P5, P7, P8, P10 and P11, respectively. Each of these read operations must specify different memory banks within the corresponding memory partitions. In response, eight read data values are provided on read data buses RD_01, RD_02, RD_11, RD_12, RD_21, RD_22, RD_31 and RD_32 of ports P1, P2, P4, P5, P7, P8, P10 and P11, respectively.

Similarly, four write operations may be initiated by providing write addresses on the write address buses WA_0, WA_1, WA_2 and WA_3 of ports P3, P6, P9 and P12, respectively, and providing write data values on the write data buses WD_0, WD_1, WD_2 and WD_3 of ports P3, P6, P9 and P12, respectively.

The use of memory partitions $MP_0$-$MP_3$ in memory system 400 adds an additional level of hierarchy to the structure of memory system 200, thereby allowing for multiplication of the number of simultaneously accessible ports, with minimal area overhead. The additional area overhead associated with memory system 400 is less than 5 percent, when compared with a conventional single-ported memory structure having the same capacity.

The maximum operating frequency of memory system 400 is equal to the operating frequency of the memory banks times the number of ports per memory partition, times the number of memory partitions. Assuming that each of the memory banks of memory system 400 operates at a frequency F, then memory system 400 may operate at a maximum frequency of 3×4×F. That is, eight read operations may be simultaneously performed at frequency F on ports P1, P2, P4, P5, P7, P8, P10 and P11, while four write operations are simultaneously performed at frequency F on ports P3, P6, P9 and P12.

Although memory system 400 includes four memory partitions, with three ports per memory partition, it is understood that memory system 400 can include other numbers of memory partitions, having other numbers of ports per memory partition, in other embodiments.

Although the invention has been described in connection with several embodiments, it is understood that this invention is not limited to the embodiments disclosed, but is capable of various modifications, which would be apparent to a person skilled in the art. Accordingly, the present invention is limited only by the following claims.

We claim:

1. A method comprising:
    simultaneously transmitting a plurality of bank access addresses from each of a first plurality of ports to each of a first plurality of memory banks implemented with single-port memory cells, wherein each of the first plurality of ports is designated as either a read port or a write port; and
    during each access cycle, within each memory bank of the first plurality of memory banks:
        comparing a unique bank address assigned to the memory bank with the bank access addresses provided from each of the first plurality of ports;
        initiating a read operation to the memory bank in response to detecting that the unique bank address assigned to the memory bank matches a bank access address provided by a port of the first plurality of ports designated as a read port; and
        initiating a write operation to the memory bank in response to detecting that the unique bank address assigned to the memory bank matches a bank access address provided by a port of the first plurality of ports designated as a write port.

2. The method of claim 1, wherein the step of initiating a read operation to the memory bank comprises causing an access control signal to have a first value that specifies a read operation to the memory bank in response to detecting that the unique bank address assigned to the memory bank matches the bank access address provided by a port of the first plurality of ports designated as a read port.

3. The method of claim 2, wherein the step of initiating a write operation to the memory bank comprises causing the access control signal to have a second value that specifies a write operation to the memory bank in response to detecting that the unique bank address assigned to the memory bank matches the bank access address provided by a port of the first plurality of ports designated as a write port.

4. The method of claim 1, further comprising:
    providing bank access addresses from each of a second plurality of ports to each of a second plurality of memory banks implemented with single port memory cells, wherein each of the second plurality of ports is designated as either a read port or a write port; and
    during each access cycle, within each memory bank of the second plurality of memory banks:
        comparing a unique bank address assigned to the memory bank with the bank access addresses provided from each of the second plurality of ports;
        initiating a read operation to the memory bank in response to detecting that the unique bank address assigned to the memory bank matches a bank access address provided by a port of the second plurality of ports designated as a read port; and
        initiating a write operation to the memory bank in response to detecting that the unique bank address assigned to the memory bank matches a bank access address provided by a port of the second plurality of ports designated as a write port.

5. A memory system comprising:
    one or more memory partitions, each including:
        a first plurality of ports, each designated as either a read port or a write port, wherein each of the first plurality of ports includes a corresponding address bus that carries a bank address; and
        a first plurality of memory banks, each assigned a corresponding unique bank address, and each comprising a corresponding array of single port memory cells and a corresponding access control circuit, wherein each access control circuit is coupled to each of the first plurality of ports, and wherein each access control circuit compares the corresponding unique bank address with the bank addresses provided on the address buses of the first plurality of ports, and in response, initiates a read operation if the unique bank address matches a bank address provided by a read port, and initiates a write operation if the unique bank address matches a bank address provided by a write port.

6. The memory system of claim 5, wherein there are M memory partitions and N ports in each of the memory partitions, wherein each of the memory banks operates at a frequency F, and wherein operations in the memory system are performed at a frequency of M×N×F.

7. The memory system of claim 5, wherein each of the first plurality of ports further includes a corresponding data bus, separate from the corresponding address bus.

* * * * *